United States Patent
Wu et al.

(10) Patent No.: US 11,913,121 B2
(45) Date of Patent: Feb. 27, 2024

(54) FABRICATION METHOD OF SUBSTRATE HAVING ELECTRICAL INTERCONNECTION STRUCTURES

(71) Applicant: Siliconware Precision Industries Co., Ltd., Taichung (TW)

(72) Inventors: Po-Yi Wu, Taichung (TW); Chun-Hung Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 680 days.

(21) Appl. No.: 16/991,999

(22) Filed: Aug. 12, 2020

(65) Prior Publication Data

US 2020/0370184 A1    Nov. 26, 2020

Related U.S. Application Data

(62) Division of application No. 15/867,919, filed on Jan. 11, 2018, now Pat. No. 10,774,427, which is a
(Continued)

(30) Foreign Application Priority Data

Apr. 16, 2014 (TW) .................................. 103113822
Jul. 29, 2014 (TW) .................................. 103125795

(51) Int. Cl.
*C23F 1/00* (2006.01)
*H01L 23/498* (2006.01)
(Continued)

(52) U.S. Cl.
CPC .............. *C23F 1/00* (2013.01); *H01L 21/486* (2013.01); *H01L 23/147* (2013.01);
(Continued)

(58) Field of Classification Search
CPC ...... C23F 1/00; H01L 21/4857; H01L 21/486; H01L 2224/11; H01L 2224/16225
See application file for complete search history.

(56) References Cited

U.S. PATENT DOCUMENTS 6,413,851 B1  7/2002 Chow et al.
6,593,220 B1  7/2003 Yu et al.
(Continued)

*Primary Examiner* — Minh N Trinh
(74) *Attorney, Agent, or Firm* — Studebaker & Brackett PC

(57) ABSTRACT

A method for fabricating a substrate having an electrical interconnection structure is provided, which includes the steps of: providing a substrate body having a plurality of conductive pads and first and second passivation layers sequentially formed on the substrate body and exposing the conductive pads; forming a seed layer on the second passivation layer and the conductive pads; forming a first metal layer on each of the conductive pads, wherein the first metal layer is embedded in the first and second passivation layers without being protruded from the second passivation layer; and forming on the first metal layer a second metal layer protruded from the second passivation layer. As such, when the seed layer on the second passivation layer is removed by etching using an etchant, the etchant will not erode the first metal layer, thereby preventing an undercut structure from being formed underneath the second metal layer.

3 Claims, 16 Drawing Sheets

Related U.S. Application Data division of application No. 14/688,510, filed on Apr. 16, 2015, now Pat. No. 9,903,024.

(51) Int. Cl.
  *H01L 21/48* (2006.01)
  *H01L 23/14* (2006.01)
  *H05K 3/10* (2006.01)

(52) U.S. Cl.
  CPC .. *H01L 23/49811* (2013.01); *H01L 23/49827* (2013.01); *H05K 3/108* (2013.01); *H01L 21/4857* (2013.01); *H01L 23/49822* (2013.01); *H01L 23/49894* (2013.01); *H01L 2224/11* (2013.01); *H01L 2224/16225* (2013.01); *H01L 2224/32225* (2013.01); *H01L 2224/73204* (2013.01); *H01L 2924/15174* (2013.01); *H01L 2924/15311* (2013.01); *Y10T 29/49165* (2015.01)

(56) References Cited

U.S. PATENT DOCUMENTS

| | | |
|---|---|---|
| 6,630,736 B1 | 10/2003 | Ignaut |
| 6,740,577 B2 | 5/2004 | Jin et al. |
| 6,878,633 B2 | 4/2005 | Raskin et al. |
| 7,250,362 B2 | 7/2007 | Huang |
| 7,341,949 B2 | 3/2008 | Chien et al. |
| 7,915,088 B2 | 3/2011 | Kobayashi et al. |
| 7,960,270 B2 | 6/2011 | Lee et al. |
| 7,969,003 B2 | 6/2011 | Huang |
| 7,994,045 B1 | 8/2011 | Huemoeller et al. |
| 8,215,011 B2 | 7/2012 | Ahn et al. |
| 8,298,930 B2 | 10/2012 | Arvin et al. |
| 8,399,989 B2 | 3/2013 | Lin et al. |
| 8,533,942 B2 | 9/2013 | Ohashi et al. |
| 8,765,531 B2 | 7/2014 | Gatterbauer et al. |
| 8,901,736 B2 | 12/2014 | Shen et al. |
| 9,706,652 B2 | 7/2017 | Ryu et al. |
| 9,903,024 B2 | 2/2018 | Wu et al. |
| 2005/0082685 A1 | 4/2005 | Bojkov et al. |
| 2005/0258539 A1 | 11/2005 | Minda |
| 2007/0087544 A1 | 4/2007 | Chang et al. |
| 2007/0130763 A1 | 6/2007 | Hsu et al. |
| 2007/0155155 A1 | 7/2007 | Tanida et al. |
| 2007/0182004 A1 | 8/2007 | Rinne |
| 2008/0050905 A1 | 2/2008 | Uchida et al. |
| 2008/0054461 A1 | 3/2008 | Lang et al. |
| 2008/0284016 A1 | 11/2008 | Huang et al. |
| 2009/0032942 A1 | 2/2009 | Choi |
| 2009/0098723 A1 | 4/2009 | Yu |
| 2009/0115074 A1 | 5/2009 | Hammer et al. |
| 2009/0115075 A1 | 5/2009 | Kessel et al. |
| 2010/0165585 A1 | 7/2010 | Lin et al. |
| 2011/0049705 A1 | 3/2011 | Liu et al. |
| 2011/0084390 A1 | 4/2011 | Chen |
| 2011/0284282 A1 | 11/2011 | Ishida et al. |
| 2012/0012985 A1 | 1/2012 | Shen et al. |
| 2012/0056318 A1 | 3/2012 | Seto |
| 2013/0022830 A1 | 1/2013 | Hsieh et al. |
| 2014/0060902 A1 | 3/2014 | Hu |
| 2014/0116760 A1 | 5/2014 | Wang |
| 2020/0370184 A1* | 11/2020 | Wu ............... H01L 23/49827 |

* cited by examiner

FIG. 2A"

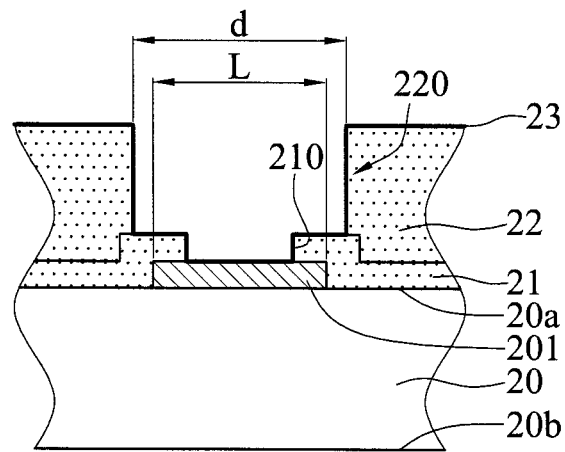
FIG. 2C
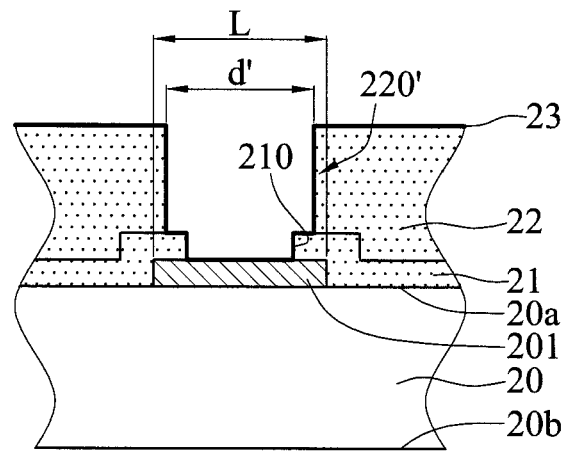
FIG. 2C'
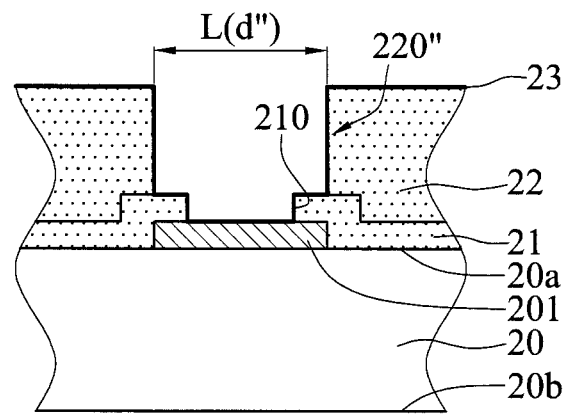
FIG. 2C"

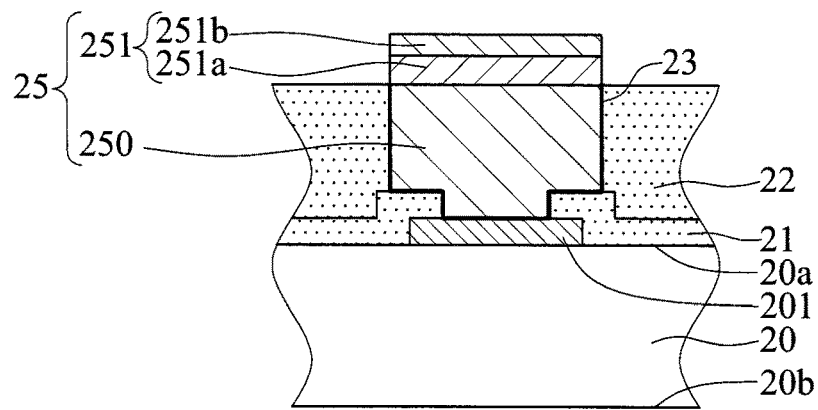
FIG. 2G
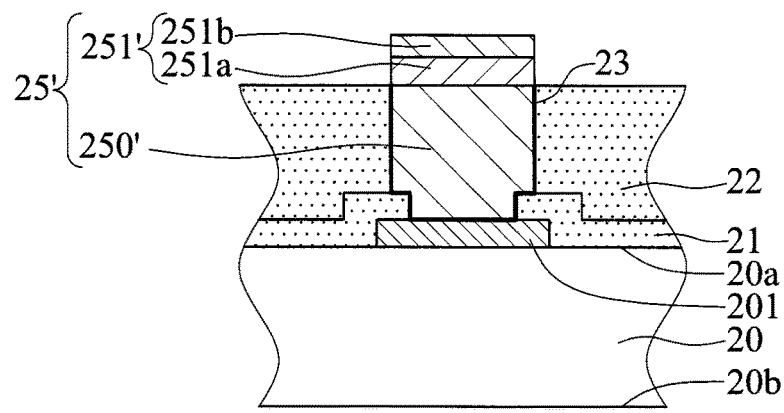
FIG. 2G'
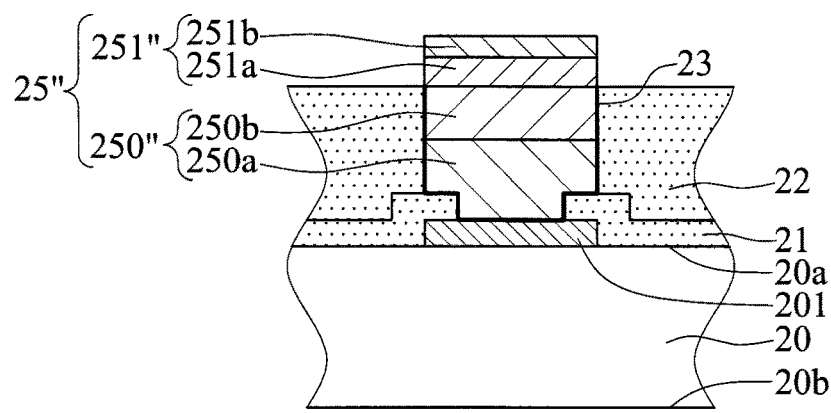
FIG. 2G"

FABRICATION METHOD OF SUBSTRATE HAVING ELECTRICAL INTERCONNECTION STRUCTURES

CROSS-REFERENCE TO RELATED APPLICATION(S)

This application is a divisional of copending application U.S. Ser. No. 15/867,919, filed on Jan. 11, 2018, which is a divisional of U.S. Ser. No. 14/688,510, filed on Apr. 16, 2015, now U.S. Pat. No. 9,903,024, which claims under 35 U.S.C. § 119(a) the benefit of Taiwanese Application No. 103125795, filed Jul. 29, 2014 and Taiwanese Application No. 103113822, filed Apr. 16, 2014, the entire contents of which are incorporated herein by reference.

BACKGROUND OF THE INVENTION

1. Field of the Invention

The present invention relates to substrates having improved electrical interconnection structures and fabrication methods thereof.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

According to the current 3D IC chip stacking technologies, a silicon interposer is generally disposed between a packaging substrate and at least a semiconductor chip having a high routing density for electrically connecting the packaging substrate to the semiconductor chip, thereby achieving the purpose of integration of the semiconductor chip having a high routing density.

FIGS. 1A to 1E are schematic cross-sectional views showing a method for fabricating a silicon interposer 1 according to the prior art.

Referring to FIG. 1A, a silicon substrate body 10 having opposite first and second surfaces 10a, 10b is provided. A plurality of conductive through holes 100 are formed to penetrate the first and second surfaces 10a, 10b of the silicon substrate body 10 and a plurality of conductive pads 101 are formed on the first surface 10a and the conductive through holes 100.

Then, a passivation layer 11 is formed on the first surface 10a of the silicon substrate body 10 and each of the conductive pads 101 is partially exposed from the passivation layer 11.

Thereafter, a seed layer 13 is formed on the passivation layer 11 and the conductive pads 101 and an electroplated copper layer 12 is then formed on the seed layer 13. The seed layer 13 can be made of Ti/Cu.

Subsequently, a resist layer 14 is formed on the electroplated copper layer 12 and portions of the electroplated copper layer 12 corresponding in position to the conductive pads 101 are exposed from the resist layer 14.

Then, a metal portion 15 is formed on each of the exposed portions of the electroplated copper layer 12. The metal portion 15 consists of a copper layer 150 bonded to the exposed portion of the electroplated copper layer 12, a nickel layer 151 bonded to the copper layer 150 and a gold layer 152 formed on the nickel layer 151. The gold layer 152 is the outermost layer of the metal portion 15.

Referring to FIG. 1B, the resist layer 14 and the electroplated copper layer 12 under the resist layer 14 are removed.

Referring to FIG. 1C, by using the nickel layer 151 and the gold layer 152 as an etch stop layer, an etching process is performed to remove the seed layer 13 around a periphery of each of the metal portions 15. As such, the metal portions 15 are electrically connected to the corresponding conductive pads 101, respectively.

Referring to FIG. 1D, an RDL (redistribution layer) process is performed on the second surface 10b of the silicon substrate body 10. That is, the first surface 10a of the silicon substrate body 10 and the metal portions 15 are bonded to a carrier 16 through an adhesive layer 160 and then an RDL structure 17 is formed on the second surface 10b of the silicon substrate body 10 and electrically connected to the conductive through holes 100.

Referring to FIG. 1E, a stealth dicing process is performed for singulation and then the carrier 16 and the adhesive layer 160 are removed, thus obtaining a plurality of silicon interposers 1. In particular, laser scanning is performed inside the silicon substrate body 10 to form embedded cutting lines along which the silicon substrate body 10 can be separated to form a plurality of silicon interposers 1. Thereafter, hot air is provided to cause the adhesive layer 160 to thermally expand, thereby facilitating to take out the silicon interposers 1. As such, the singulation process is completed.

Subsequently, referring to FIG. 1F, such a silicon interposer 1 can be applied in a 3D stacking process to form a semiconductor package 1'. In particular, the RDL structure 17 of the silicon interposer 1 is electrically connected to a plurality of bonding pads 180 of a packaging substrate 18 through a plurality of conductive elements 170, and an underfill 181 is formed between the silicon interposer 1 and the packaging substrate 18 to encapsulate the conductive elements 170. The bonding pads 180 of the packaging substrate 18 have a large pitch therebetween. Further, a plurality of electrode pads 190 of a semiconductor chip 19 are electrically connected to the conductive pads 101 through a plurality of conductive elements 15a and an underfill 191 is formed between the silicon interposer 1 and the semiconductor chip 19 to encapsulate the conductive elements 15a. The electrode pads 190 of the semiconductor chip 19 have a small pitch therebetween.

Referring to FIG. 1G, to form the conductive elements 15a, conductive bumps 153 containing a solder material are first formed on the metal portions 15. Then, the electrode pads 190 are aligned and connected to the conductive bumps 153. Thereafter, the conductive bumps 153 are reflowed.

However, in the above-described method of the silicon interposer 1, when the seed layer 13 is etched, a portion of the copper layer 150 of the metal portion 15 is also easily etched. Consequently, an undercut structure 15', as shown in FIG. 1C, is formed underneath the nickel layer 151 and the gold layer 152. As such, after the silicon interposer 1 is separated from the carrier 16, as shown in FIG. 1E, some adhesive residual 160' may remain on the undercut structure 15' even if the silicon interposer 1 is cleaned by such as water. Therefore, as shown in FIG. 1G, during formation of the conductive bump 153 containing the solder material, the adhesive residual 160' easily flows to the interface between the conductive bump 153 and the gold layer 152, thereby resulting in a poor bonding between the conductive pad 101 and the conductive bump 153 and consequently reducing the electrical interconnection quality between the semiconductor chip 19 and the silicon interposer 1. Accordingly, the reliability of the semiconductor package 1' is reduced.

Therefore, how to overcome the above-described drawbacks has become critical.

SUMMARY OF THE INVENTION

In view of the above-described drawbacks, the present invention provides a substrate having an electrical interconnection structure, which comprises: a substrate body having a plurality of conductive pads; a first passivation layer formed on the substrate body and formed with a plurality of first openings for exposing at least a portion of each of the conductive pads; a second passivation layer formed on the first passivation layer and formed with a plurality of second openings corresponding in position to the first openings for exposing the exposed portion of each of the conductive pads; a first metal layer formed on the exposed portion of each of the conductive pads and the first passivation layer, and embedded in the second passivation layer without being protruded from the second passivation layer; and a second metal layer formed on the first metal layer and protruded from the second passivation layer.

In the above-described substrate, the substrate body can be made of a non-conductive material.

In the above-described substrate, a conductive trace portion can be formed on the substrate body in a manner that the conductive pads and the first passivation layer are formed on the conductive trace portion.

In the above-described substrate, a plurality of conductive through holes can be formed in the substrate body in a manner that the conductive pads are formed on ends of the conductive through holes.

In the above-described substrate, a UBM (under bump metallurgy) structure is formed by the first metal layer and the second metal layer.

In the above-described substrate, the first metal layer consists of a base portion formed on a corresponding one of the conductive pads and a connection portion formed on the base portion.

In the above-described substrate, the material of the first metal layer is different from that of the second metal layer.

In the above-described substrate, the first metal layer can be a copper layer, and the second metal layer can be a nickel layer, a gold layer or a combination thereof.

The above-described substrate can further comprise a seed layer formed between the first metal layer and the corresponding conductive pads. The material of the second metal layer is different from that of the seed layer. The seed layer can be made of titanium, copper or a combination thereof.

The above-described substrate can further comprise a plurality of conductive bumps formed on the second metal layer. The conductive bump is made of a solder material.

In an embodiment, a portion of the second passivation layer is positioned over a corresponding one of the conductive pads. In another embodiment, the second passivation layer is free from being positioned over the conductive pads.

The present invention further provides a method for fabricating a substrate having an electrical interconnection structure, which comprises the steps of: forming a first passivation layer on a substrate body having a plurality of conductive pads and forming a plurality of first openings in the first passivation layer for exposing at least a portion of each of the conductive pads; forming a second passivation layer on the first passivation layer, wherein the second passivation layer is formed with a plurality of openings corresponding in position to the first passivation layer for exposing the exposed portion of each of the conductive pads; forming a first metal layer on the exposed portion of each of the conductive pads in the first openings of the first passivation layer and the second openings of the second passivation layer, wherein the first metal layer is embedded in the first and the second passivation layers without being protruded from the second passivation layer; and forming a second metal layer on the first metal layer, wherein the second metal layer is protruded from the second passivation layer.

In the above-described substrate and method, the second passivation layer can be thicker than the first passivation layer.

Before forming the first metal layer, the above-described method can further comprise forming a seed layer formed on the second passivation layer, inner surface of the first openings of the first passivation layer and the second openings of the second passivation layer, and the exposed portion of each of the conductive pads such that after formation of the first metal layer, a portion of the seed layer is positioned between the first metal layer and the corresponding conductive pads. After forming the second metal layer, the method can further comprise removing the seed layer on the second passivation layer.

In the above-described method, the width of each of the first and second openings is greater than, equal to or less than that of each of the conductive pads.

The present invention further provides another method for fabricating a substrate having an electrical interconnection structure, which comprises the steps of: forming a passivation layer on a substrate body having a plurality of conductive pads, wherein at least a portion of each of the conductive pads is exposed from the passivation layer; forming a first metal layer on the exposed portion of each of the conductive pads and a portion of the passivation layer, wherein the first metal layer has an extending portion; forming a second metal layer on the first metal layer, wherein the second metal layer does not cover the extending portion of the first metal layer; and removing the extending portion of the first metal layer.

Before forming the first metal layer, the above-described method can further comprise forming a seed layer on the passivation layer and the exposed portion of each of the conductive pads such that after formation of the first metal layer, a portion of the seed layer is positioned between the first metal layer and the corresponding conductive pads and between the first metal layer and the passivation layer; and the step of removing the extending portion of the first metal layer can further comprise removing the seed layer under the extending portion.

The present invention provides a further method for fabricating a substrate having an electrical interconnection structure, which comprises the steps of: forming a first resist layer on a substrate body having a plurality of conductive pads, and forming a second resist layer on the first resist layer, wherein the first resist layer has a plurality of first openings and the second resist layer has a plurality of second openings in communication with the first openings, the first openings are larger in size than the second openings, and at least a portion of each of the conductive pads is exposed from each of the first and second openings; forming a first metal layer in each of the first openings of the first resist layer, wherein the first metal layer has an extending portion; forming a second metal layer on the first metal layer, wherein the second metal layer is positioned in the corresponding second openings and does not cover the extending portion of the first metal layer; removing the first resist layer and the second resist layer; and removing the extending portion of the first metal layer.

In the above-described method, forming the first and second openings can comprise: before forming the second resist layer, performing a first exposure process on the first resist layer to form a plurality of first exposure areas in the first resist layer; after forming the second resist layer, performing a second exposure process on the second resist layer to form a plurality of second exposure areas in the second resist layer; and performing at least a development process to form the first openings in the first exposure areas and form the second openings in the second exposure areas.

In the above-described method, forming the first and second openings can comprise: after forming the second resist layer, performing at least an exposure process on the first resist layer and the second resist layer so as to form a plurality of first exposure areas in the first resist layer and a plurality of second exposure areas in the second resist layer; and performing at least a development process to form the first openings in the first exposure areas and form the second openings in the second exposure areas.

In the above-described method, forming the first and second openings can comprise: before forming the second resist layer, performing an exposure process on the first resist layer so as to form a plurality of first exposure areas in the first resist layer; performing a first development process so as to form the first openings in the first exposure areas; after forming the second resist layer, performing an exposure process on the second resist layer so as to form a plurality of second exposure areas in the second resist layer; and performing a second development process to form the second openings in the second exposure areas.

Before forming the first resist layer, the above-described method can further comprise forming a seed layer on the conductive pads such that after formation of the first metal layer, a portion of the seed layer is positioned between the first metal layer and the corresponding conductive pads; and the step of removing the extending portion of the first metal layer can further comprise removing the seed layer under the extending portion.

In the above-described three methods, the seed layer can be removed by etching.

After removing the seed layer, the above-described three methods can further comprise forming a plurality of conductive bumps on the second metal layer.

According to the present invention, the first metal layer can be embedded in the second passivation layer without being protruded from the second passivation layer. As such, when the seed layer is removed by etching using an etchant, the etchant will not erode the first metal layer, thereby preventing an undercut structure from being formed underneath the second metal layer.

Alternatively, the first metal layer can be formed with an extending portion. As such, when the seed layer is removed by etching using an etchant, the extending portion of the first metal layer facilitates to prevent the etchant from eroding other portions of the first metal layer, thereby preventing an undercut structure from being formed underneath the second metal layer.

BRIEF DESCRIPTION OF DRAWINGS

FIGS. 2A to 2H are schematic cross-sectional views showing a method for fabricating a substrate having an electrical interconnection structure according to a first embodiment of the present invention, wherein FIGS. 2A' and 2A" show different embodiments of the substrate of the present invention, FIGS. 2C' and 2C" show other embodiments of FIG. 2C, FIGS. 2G' and 2G" show other embodiments of FIG. 2G, and FIG. 2H' shows another embodiment of FIG. 2H;

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2H are schematic cross-sectional views showing a method for fabricating a substrate 2 having an electrical interconnection according to a first embodiment of the present invention. The electrical interconnection has the function of a UBM (under bump metallurgy) structure.

Figure 2A:
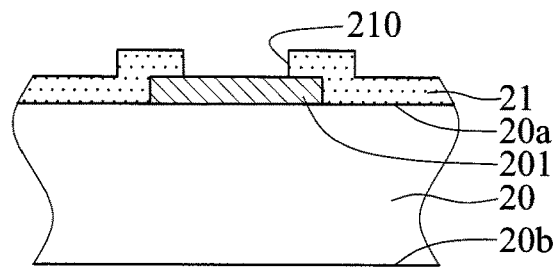
Figure 2A:
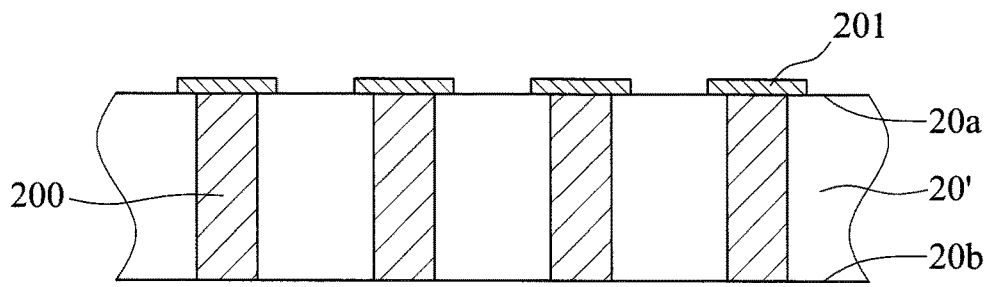

Referring to FIG. 2A, a substrate body 20 is provided. The substrate body 20 has a first surface 20a with a plurality of conductive pads 201 and a second surface 20b opposite to the first surface 20a. A first passivation layer 21 is formed on the first surface 20a of the substrate body 20 and has a plurality of first openings 210 for exposing at least a portion of each of the conductive pads 201.

In the present embodiment, the substrate body 20 is made of a non-conductive material. The conductive pads 201 are copper pads.

The first passivation layer 21 can be made of an inorganic material, such as $SiO_2$, $Si_xN_y$, and so on. Alternatively, the first passivation layer 21 can be made of an organic material, such as polyimide (PI), polybenzoxazole (PBO), benzocyclobutene (BCB) and so on.

In addition, the substrate body 20 can be made of a semiconductor material. For example, the substrate body 20 can be a glass board, a silicon interposer or a silicon wafer. Alternatively, the substrate body 20 can be made of ceramic, an insulating material or a composite material. Further, the substrate body 20 can be a packaging substrate.

In particular, referring to FIG. 2A', the substrate body 20' can be a silicon interposer. The substrate body 20' has a plurality of conductive through holes 200 penetrating the first surface 20a and the second surface 20b. The conductive pads 201 are formed on ends of the conductive through holes 200.

Alternatively, referring to FIG. 2A", the substrate body 20" can have a base portion 202 and a conductive trace portion 203 formed on the base portion 202. The base portion 202 has the plurality of conductive through holes 200 formed therein. The conductive trace portion 203 is electrically connected to the conductive through holes 200 and the conductive pads 201 and the first passivation layer 21 are formed on the conductive trace portion 203. The conductive trace portion 203 can be formed through an RDL process.

Figure 2B:
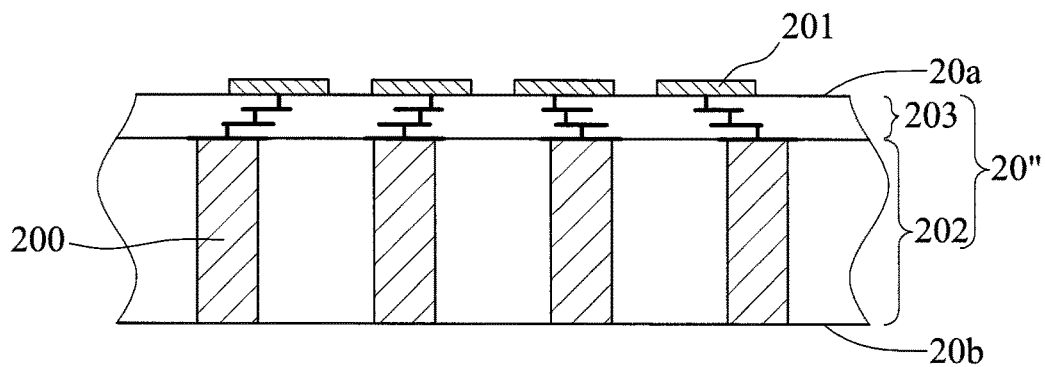
Figure 2B:
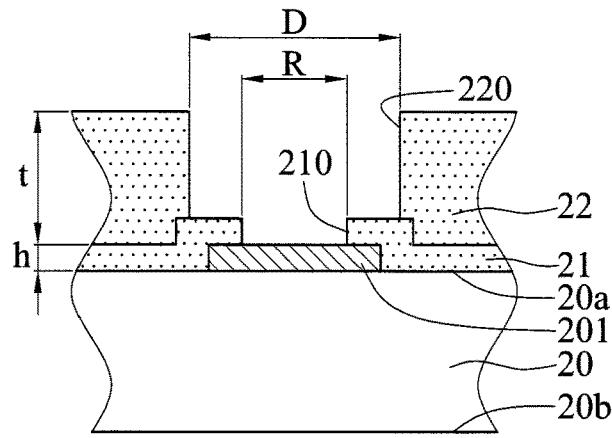

Referring to FIG. 2B, a second passivation layer 22 is formed on the first passivation layer 21 and has a plurality of second openings 220 for exposing the exposed portion of each of the conductive pads 210. The width D of each of the second openings 220 is greater than the width R of each of the first openings 210.

In the present embodiment, the thickness t of the second passivation layer 22 is greater than the thickness h of the first passivation layer 21. The thickness t of the second passivation layer 22 is 1 to 5 um.

The second passivation layer 22 can be made of an inorganic material, such as $SiO_2$, $Si_xN_y$ and so on, or made of an organic material, such as polyimide (PI), polybenzoxazole (PBO), benzocyclobutene (BCB) and so on.

The first passivation layer 21 and the second passivation layer 22 can be made of same or different materials.

Referring to FIG. 2C, a seed layer 23 is formed on the second passivation layer 22, inner surfaces of the second openings 220 and the first openings 210, and the conductive pads 201.

In the present embodiment, the seed layer 23 is made of titanium, copper or a combination thereof.

Further, the width d of the second openings 220 is greater than the width L of the conductive pads 201, and thus the second passivation layer 22 is not positioned over the conductive pads 201.

In another embodiment, a portion of the second passivation layer 22 is positioned over each of the conductive pads 201. In particular, referring to FIGS. 2C' and 2C", the width d' of the second openings 220' is less than or equal to the width L of the conductive pads 201.

Figure 2D:
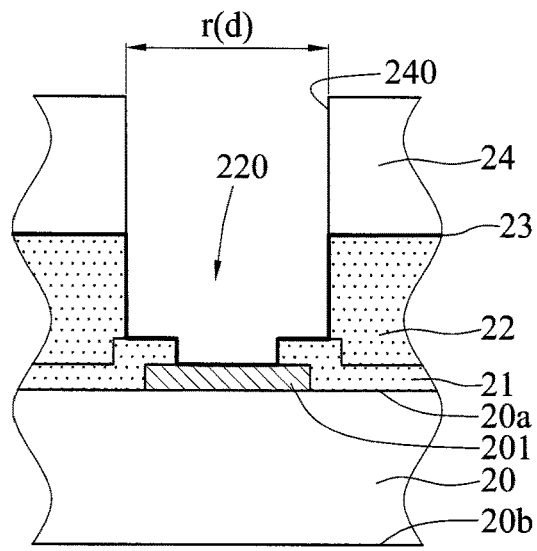

Referring to FIG. 2D, a resist layer 24 is formed on the seed layer 23 of the second passivation layer 22, with the second openings 220 exposed therefrom.

In the present embodiment, the resist layer 24 has a plurality of first openings 240 corresponding in position to the second openings 220. The width r of each of the first openings 240 is equal to or slightly greater than the width d of each of the second openings 220.

Figure 2E:
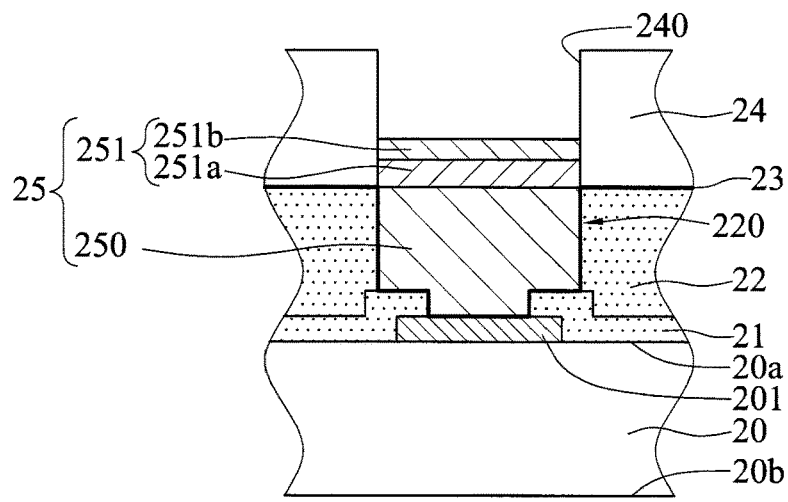

Referring to FIG. 2E, a metal structure 25 is formed in each of the first openings 240 and second openings 220 so as to be electrically connected to the corresponding conductive pad 201 and the conductive through hole 200.

In the present embodiment, the metal structure 25 includes a first metal layer 250 and a second metal layer 251 stacked on the first metal layer 250 so as to achieve the function of a UMB structure. In particular, the first metal layer 250 is formed on the seed layer 23 of the conductive pad 201 in the second opening 220 and then the second metal layer 251 is formed on the first metal layer 250.

The material of the first metal layer 250 is different from that of the second metal layer 251.

In particular, the first metal layer 250 is a copper layer and the second metal layer 251 consists of a nickel layer 251a bonded to the first metal layer 250 and a gold layer 251b bonded to the nickel layer 251a.

Further, the seed layer 23 and the first metal layer 250 can be both made of the same material.

Figure 2F:
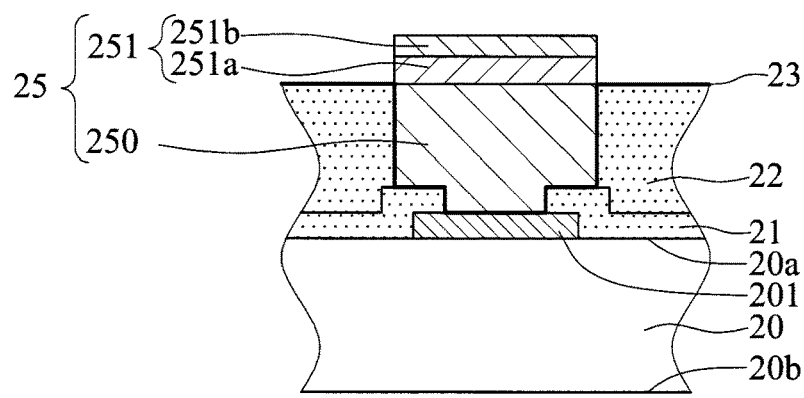

Referring to FIGS. 2F and 2G, the resist layer 24 is removed and then the seed layer 23 under the resist layer 24 is removed. Therefore, the metal structures 25 are protruded above the second passivation layer 22.

In the present embodiment, the first metal layer 250 is embedded in the first and second passivation layers 21, 22 without protruded from the second passivation layer 22, and the second metal layer 251 protrudes above the second passivation layer 22.

Further, the seed layer 23 can be removed by etching. Since the material of the second metal layer 251 is different from that of the seed layer 23, the second metal layer 251 can serve as an etch stop layer. As such, the seed layer 23 around a periphery of each of the metal structures 25 is removed, without having the second metal layer 251 undesirably etched.

If the process is continued from FIG. 2C' or FIG. 2C", a corresponding structure having the metal structures 25' or 25" will be formed, as shown in FIG. 2G' or 2G". Referring to FIGS. 2G' and 2G", the size of the metal structures 25', 25", i.e., the sizes of the first metal layer 250', 250" and the second metal layer 251', 251", is correspondingly changed.

In another embodiment, referring to FIG. 2G'", if each of the conductive pads 201 is made of aluminum, the first metal layer 250" can have a base portion 250a formed on the conductive pad 201 and a connection portion 250b formed on the base portion 250a.

Figure 2H:
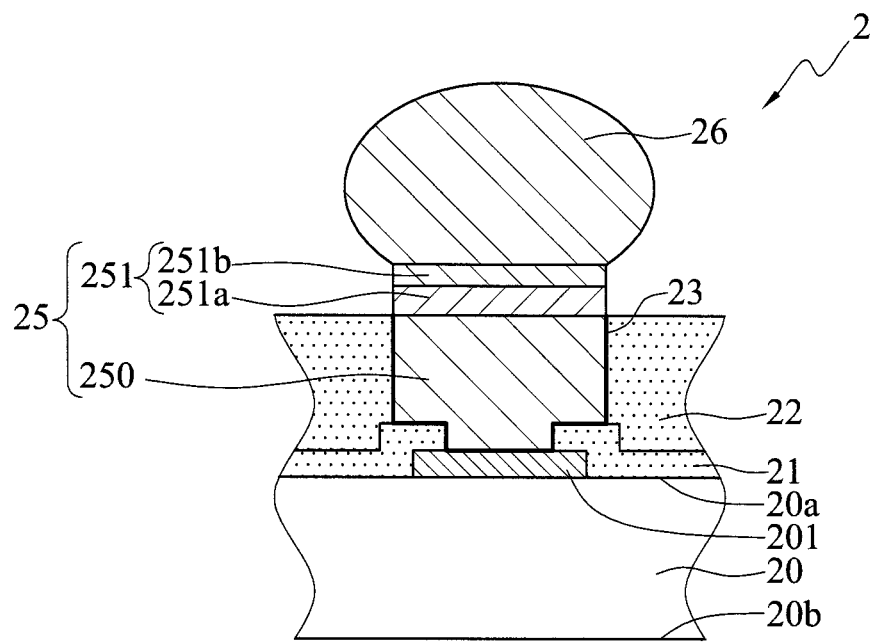
Figure 2H:
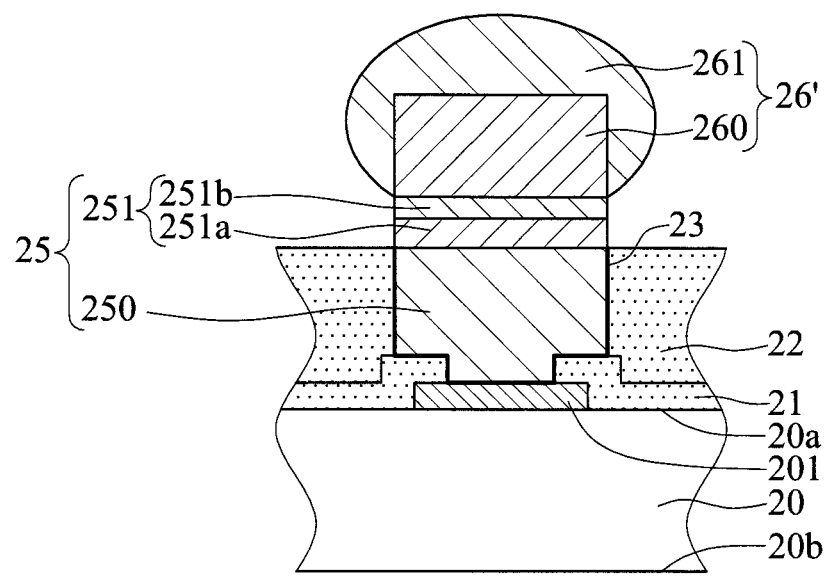

Referring to FIG. 2H, a conductive bump 26 is formed on each of the metal structures 25. The conductive bump 26 can be a solder ball.

Further, referring to FIG. 2H', the conductive bump 26' can have a base portion 260 formed on the second metal layer 251 and a solder material 261 formed on the base portion 260.

Further, the electrical interconnection at least has the metal structure 25 and the conductive pad 201 thereunder.

Figure 1A:
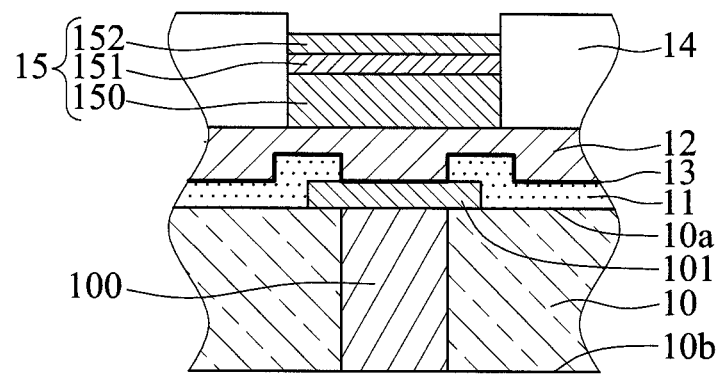
FIGS. 1A to 1E are schematic cross-sectional views showing a method for fabricating a silicon interposer according to the prior art.
Figure 1B:
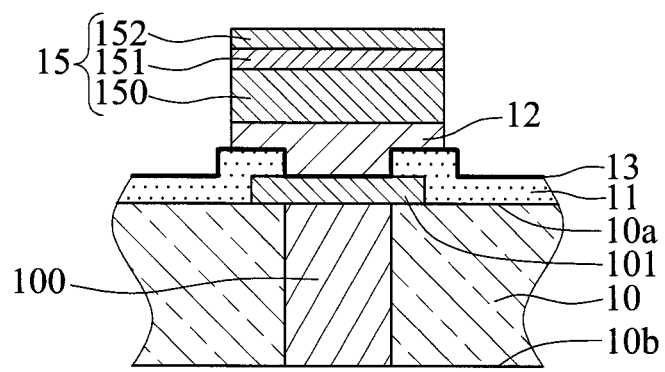
Figure 1C:
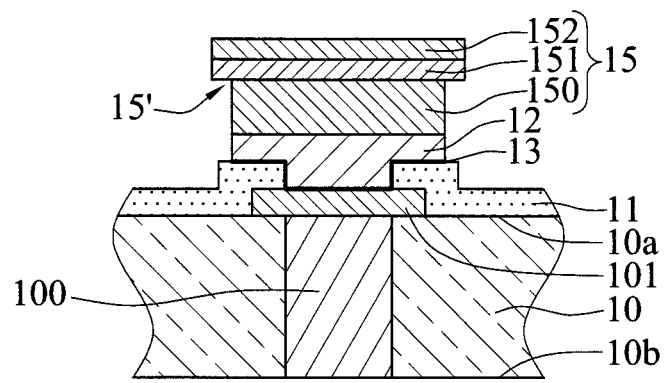
Figure 1D:
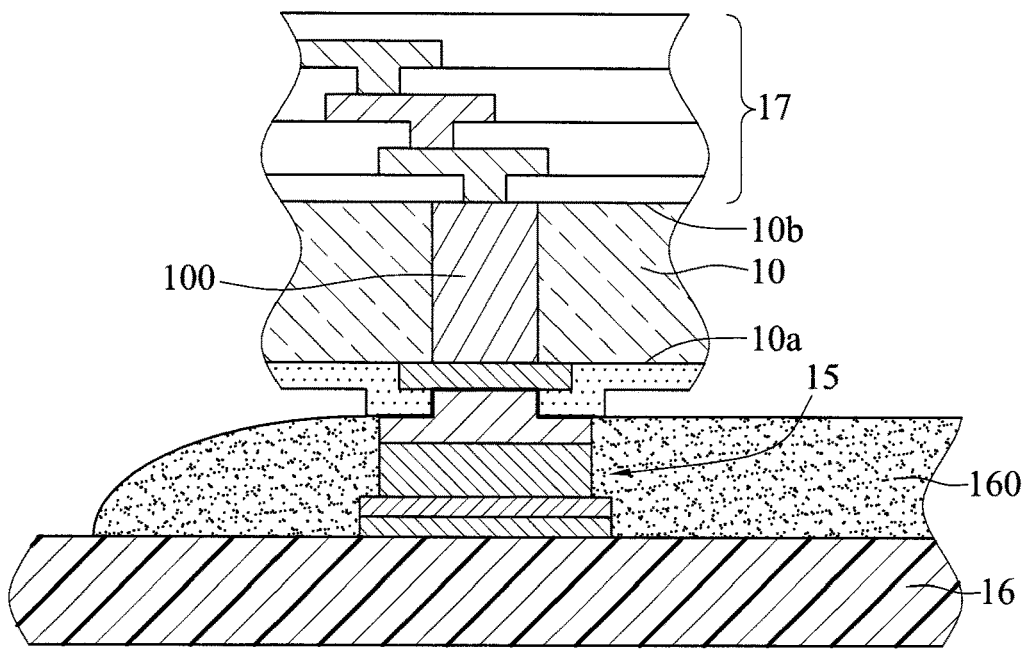
Figure 1E:
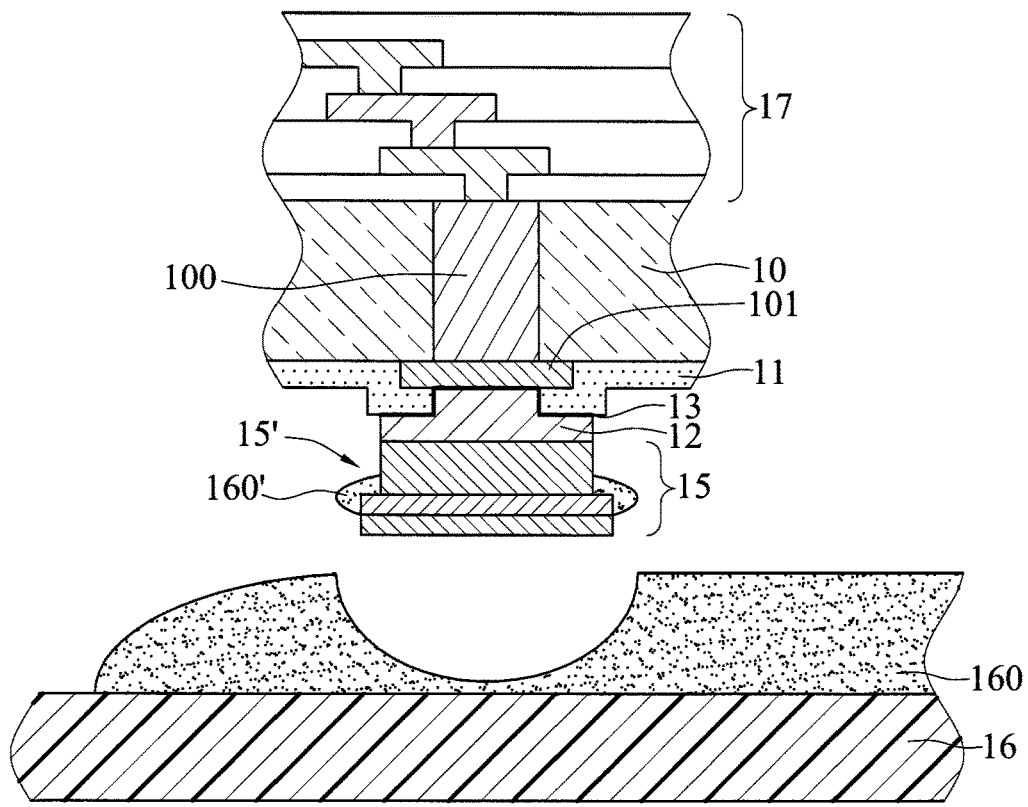
Figure 1F:
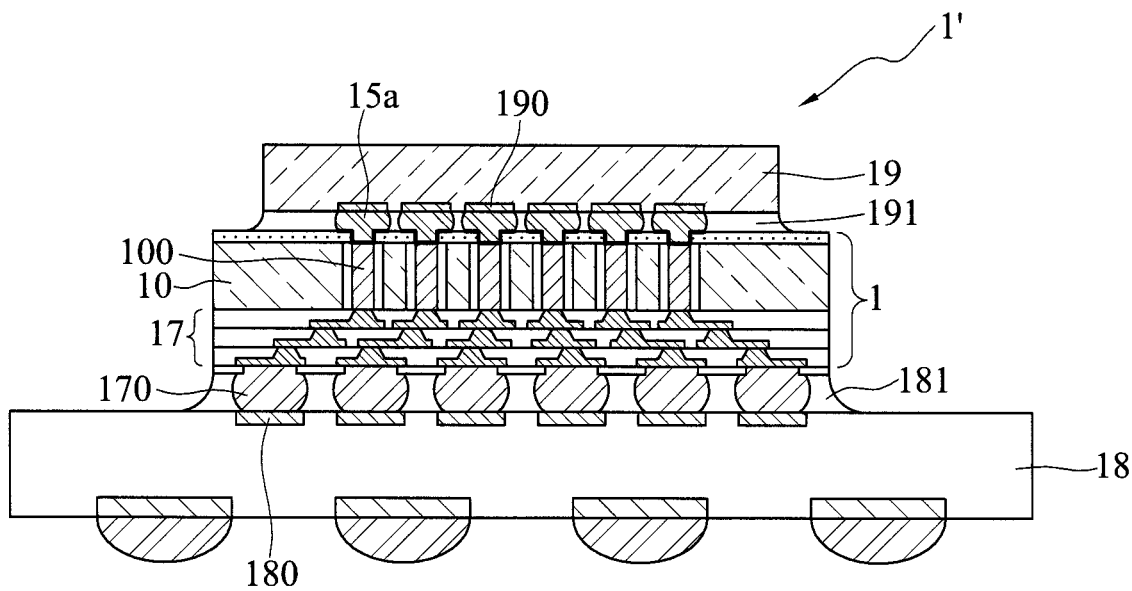
FIG. 1F is a schematic cross-sectional view of a conventional semiconductor package.
Figure 1G:
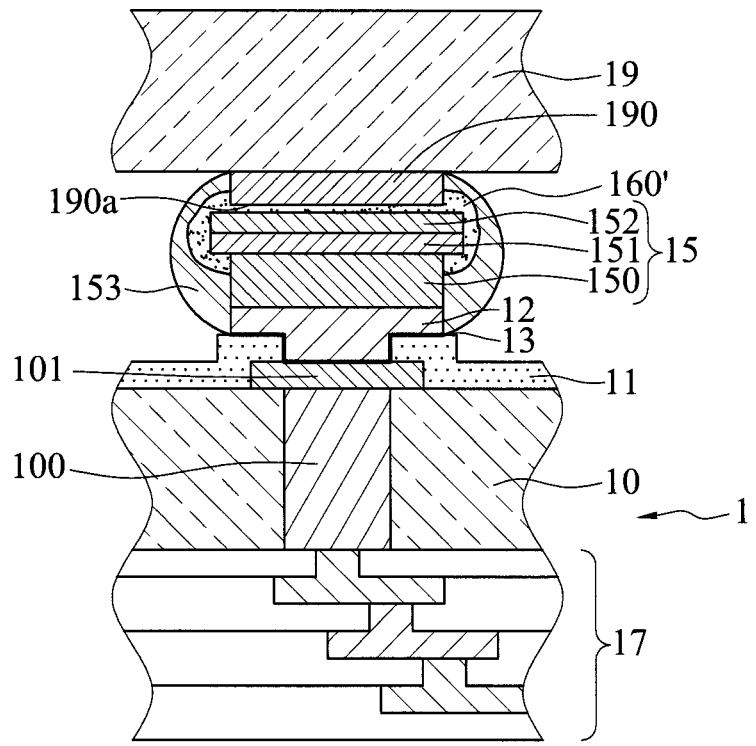
FIG. 1G is a partially enlarged view of FIG. 1F.

Subsequently, the substrate 2 can be applied to a packaging process. If the substrate body 20 is an interposer, an RDL process can be performed on the second surface 20b of the substrate body 20. That is, an RDL structure (referring to the RDL structure 17 of FIG. 1D) is formed on the second surface 20b of the substrate body 20 and electrically connected to the conductive through holes 200.

According to the method of the present embodiment, the first metal layer 250, 250', 250" is embedded in the second passivation layer 22 without being protruded from the second passivation layer 22. Therefore, when the seed layer 23 around the periphery of each of the metal structures 25 is removed by etching using an etchant, the etchant will not erode the first metal layer 250, 250', 250", thereby preventing an undercut structure from being formed underneath the second metal layer 251.

FIGS. 3A to 3H are schematic cross-sectional views showing a method for fabricating a substrate 3 according to a second embodiment of the present invention.

Figure 3A:
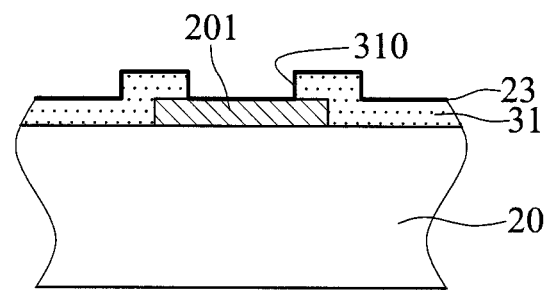
FIGS. 3A to 3H are schematic cross-sectional views showing a method for fabricating a substrate having an electrical interconnection structure according to a second embodiment of the present invention.

Referring to FIG. 3A, only a passivation layer 31 is formed on the first surface 20a of the substrate body 20 and a plurality of openings 310 are formed in the passivation layer 31 for exposing at least a portion of each of the conductive pads 201. Then, a seed layer 23 is formed on the passivation layer 31, inner surfaces of the openings 310 and the conductive pads 201.

Figure 3B:
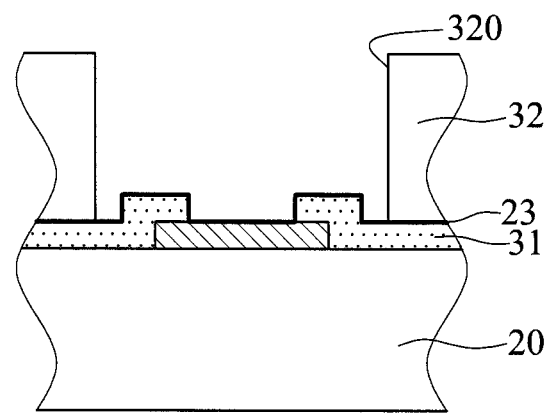

Referring to FIG. 3B, a first resist layer 32 is formed on the seed layer 23 and has a plurality of first openings 320 for exposing portions of the seed layer 23 corresponding in position to the conductive pads 201.

Figure 3C:
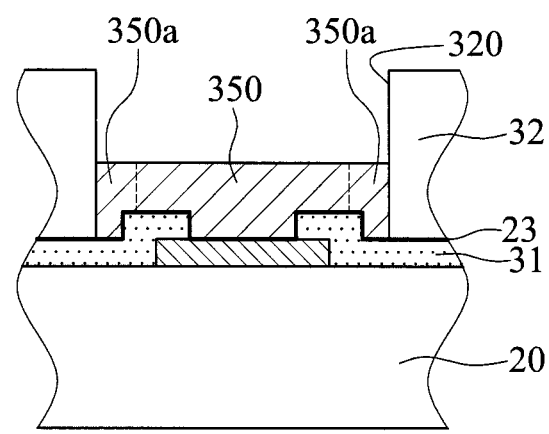

Referring to FIG. 3C, a first metal layer 350 is formed in each of the first opening 320 and bonded with the seed layer 23 in each of the first openings 320.

In the present embodiment, the first metal layer 350 is a copper layer and has an extending portion 350a.

Figure 3D:
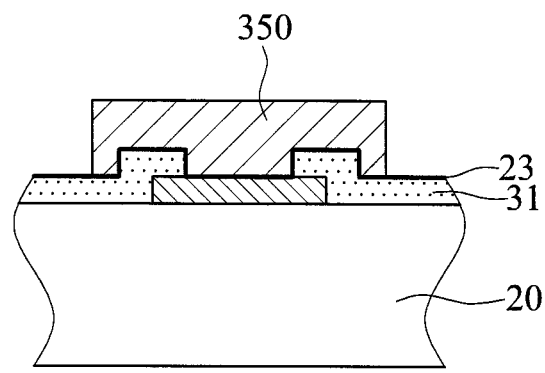

Referring to FIG. 3D, the first resist layer 32 is removed.

Figure 3E:
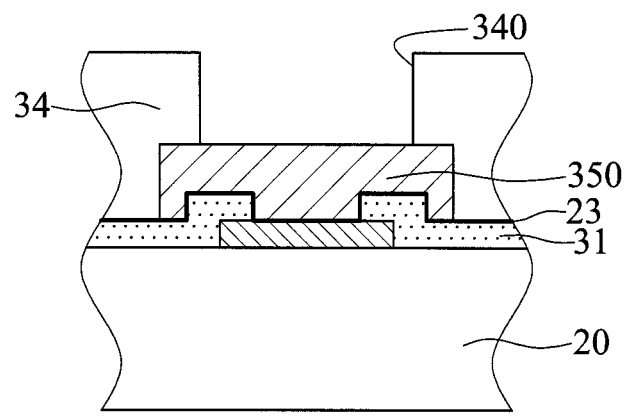

Referring to FIG. 3E, a second resist layer 34 is formed on the seed layer 23 and the first metal layer 350 and has a plurality of second openings 340 for exposing a portion of the first metal layer 350.

Figure 3F:
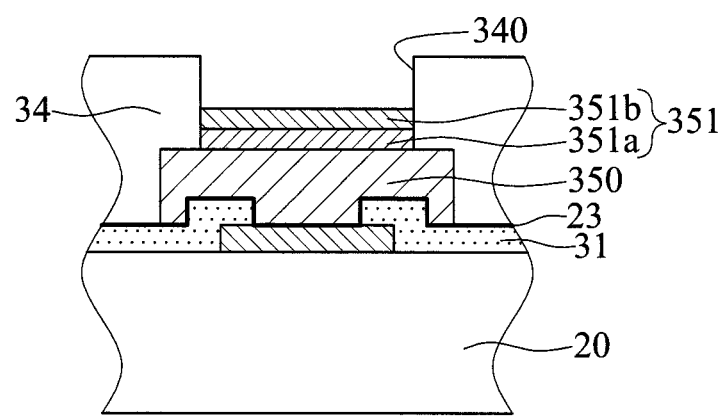

Referring to FIG. 3F, a second metal layer 351 is formed in each of the second openings 340 and on the first metal layer 350. The second metal layer 351 does not cover the extending portion 350a of the first metal layer 350.

In the present embodiment, the second metal layer 351 consists of a nickel layer 351a bonded to the first metal layer 350 and a gold layer 351b bonded to the nickel layer 351a.

Figure 3G:
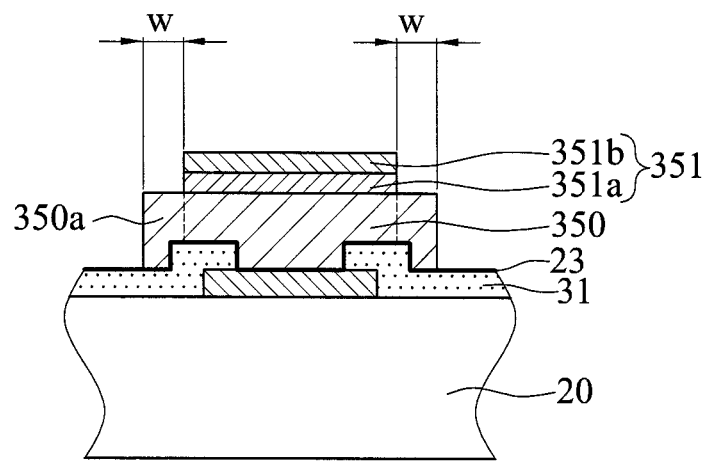
Figure 3H:
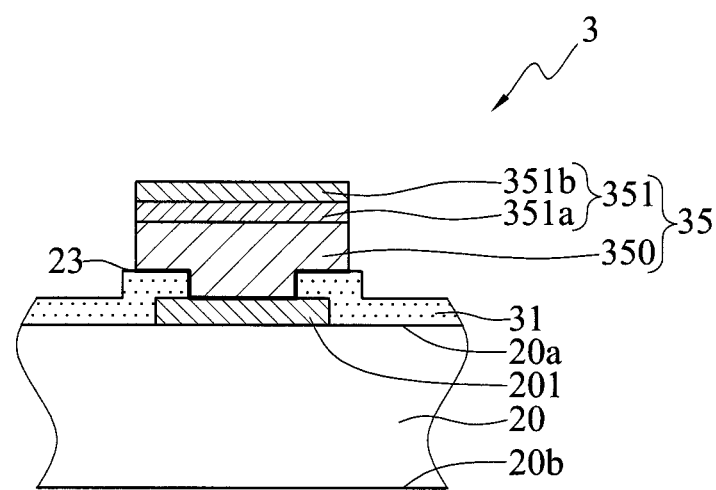

Referring to FIGS. 3G and 3H, the second resist layer 34 is removed first and then the first metal layer 350 and the seed layer 23 under the second resist layer 34 are removed. As such, the first metal layer 350 and the second metal layer 351 form a metal structure 35 that is electrically connected to the corresponding conductive pad 201 and the conductive through hole 200.

In the present embodiment, the seed layer 23 is removed by etching. Since the material of the second metal layer 351 is different from that of the seed layer 23, the second metal layer 351 can serve as an etch stop layer. As such, the seed layer 23 around a periphery of the metal structure 35 is removed by etching without etching the second metal layer 351.

After the second resist layer 34 is removed, the second metal layer 351 exposes the extending portion 350a. Therefore, when the seed layer 23 is etched, the extending portion 350a is also etched. The extending portion 350a facilitates to prevent an undercut structure from being formed underneath the second metal layer 351. Referring to FIG. 3G preferably, the extending portion 350a has a width w of 1 um. The width w of the extending portion 350a meets the condition 0.5 um≤2w≤20 um.

Thereafter, a conductive bump (referring to FIG. 2H) is formed on each of the metal structures 35 and the substrate 3 is applied in a packaging process. The electrical interconnection at least has the metal structure 35 and the conductive pad 201.

According to the method of the present embodiment, the first metal layer 350 is formed with an extending portion 350a and the second metal layer 351 is formed on the first metal layer 350 but does not cover the extending portion 350a. As such, when the seed layer 23 is removed by etching using an etchant, the extending portion 350a of the first metal layer 350 consumes the etchant so as to prevent the etchant from over-eroding the first metal layer 350, thereby preventing an undercut structure from being formed underneath the second metal layer 351 and ensuring the integrity of the metal structure 35.

FIGS. 4A to 4F are schematic cross-sectional views showing a method for fabricating a substrate 4 according to a third embodiment of the present invention.

Figure 4A:
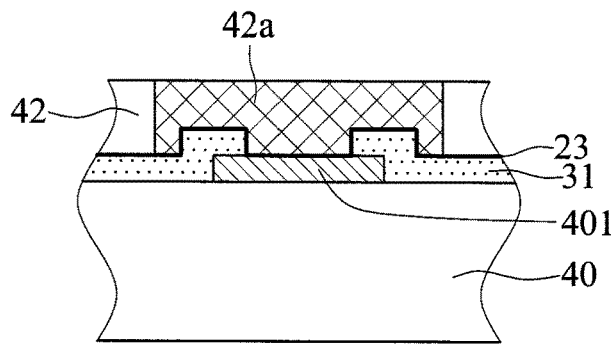
FIGS. 4A to 4F are schematic cross-sectional views showing a method for fabricating a substrate having an electrical interconnection structure according to a third embodiment of the present invention, wherein FIG. 4B' shows another embodiment of FIG. 4B.

Referring to FIG. 4A, a substrate body 40 having a plurality of conductive pads 401 is provided and a UBM layer is already formed on each of the conductive pads 401. Further, a seed layer 23 is selectively formed on the substrate body 40 and the conductive pads 401. In the present embodiment, the substrate body 40 is a silicon wafer.

Then, a first resist layer 42 is formed on the substrate body 40 and covers the conductive pads 401. Subsequently, a first exposure process is performed on the first resist layer 42 so as to form a plurality of first exposure areas 42a in the first resist layer 42. Thereafter, the first resist layer 42 is cured through a curing process.

Figure 4B:
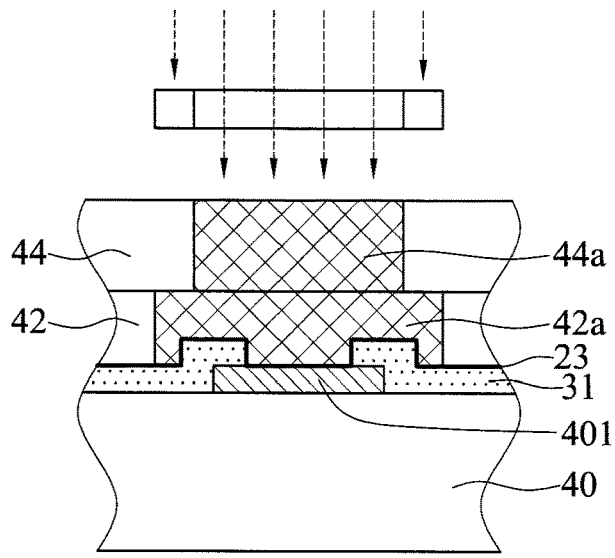
Figure 4B:
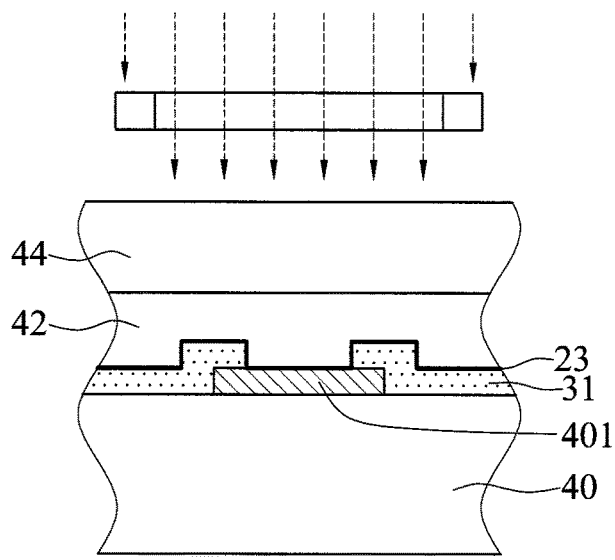

Referring to FIG. 4B, a second resist layer 44 is formed on the first resist layer 42. Then, a second exposure process is performed on the second resist layer 44 so as to form a plurality of second exposure areas 44a in the second resist layer 44.

Figure 4C:
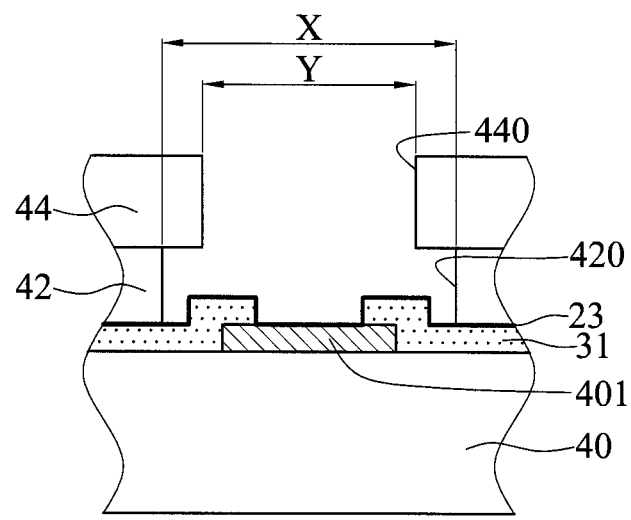

Referring to FIG. 4C, by performing a development process, the first exposure areas 42a are developed to form a plurality of first openings 420 and the second exposure areas 44a are developed to form a plurality of second openings 440.

In the present embodiment, the first openings 420 communicate with the second openings 440, the width X of each of the first openings 420 is greater than the width Y of each of the second openings 440, and the conductive pads 401 are exposed from the first and second openings 420, 440.

In another embodiment, the material of the first resist layer 42 is different from that of the second resist layer 44, i.e., the development characteristic of the first resist layer 42 can be different from that of the second resist layer 44. As such, referring to FIG. 4B', after the second resist layer 44 is formed, both the first resist layer 42 and the second resist layer 44 are exposed and developed through the same exposure and development process so as to form the first and second openings 420, 440 of FIG. 4C. In another embodiment, if the first resist layer 42 and the second resist layer 44 have the same development characteristic, after the exposure process of FIG. 4B', two development processes can be performed sequentially so as to form the second openings 440 first and then form the first openings 420.

Figure 4D:
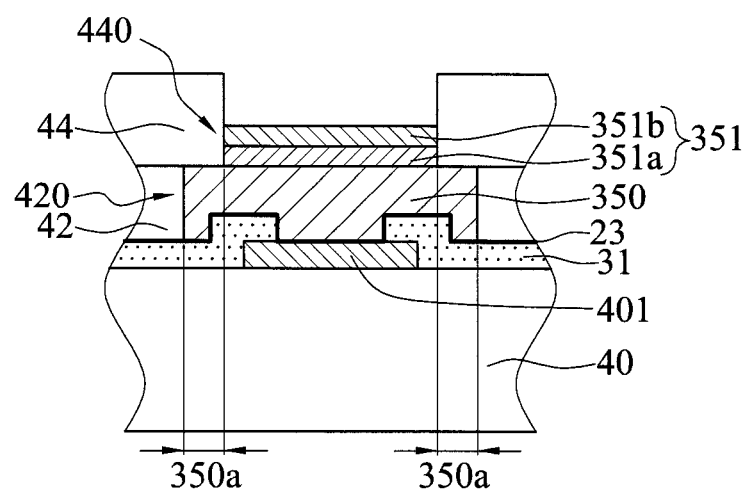

Referring to FIG. 4D, a first metal layer 350 is formed in each of the first openings 420 and bonded with the seed layer 23. Then, a second metal layer 351 is formed on the first metal layer 350. The second metal layer 351 is positioned in the corresponding second openings 440.

In the present embodiment, the first metal layer 350 is a copper layer, and has an extending portion 350a.

The second metal layer 351 does not cover the extending portion 350a of the first metal layer 350. The second metal layer 351 consists of a nickel layer 351a bonded to the first metal layer 350 and a gold layer 351b bonded to the nickel layer 351a.

Figure 4E:
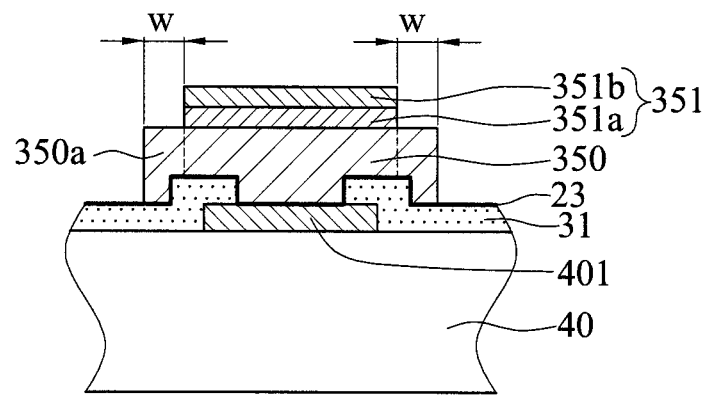

Referring to FIG. 4E, the first resist layer 42 and the second resist layer 44 are removed.

Figure 4F:
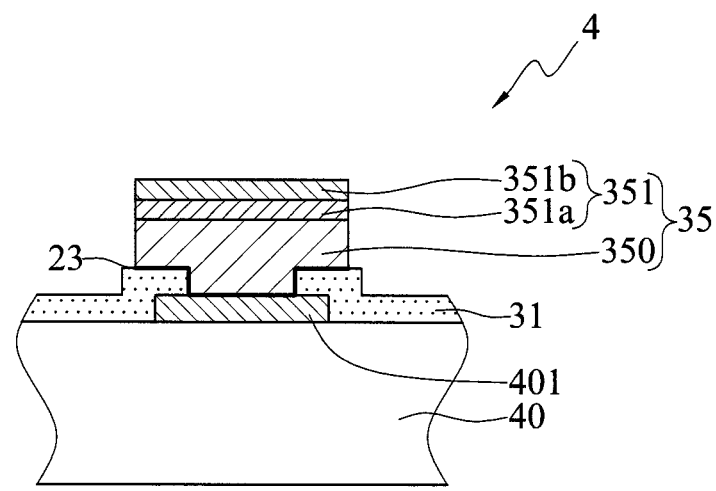

Referring to FIG. 4F, the extending portion 350a and the seed layer 23 under the extending portion 350a are removed. As such, the first metal layer 350 and the second metal layer 351 stacked on the first metal layer 350 form a metal structure 35.

In the present embodiment, the seed layer 23 is removed by etching. Since the material of the second metal layer 351 is different from that of the seed layer 23, the second metal layer 351 can serve as an etch stop layer. As such, the seed layer 23 around a periphery of the metal structure 35 is removed by etching without etching the second metal layer 351.

Referring to FIG. 4E, after the second resist layer 44 is removed, the second metal layer 351 exposes the extending portion 350a. Therefore, when the seed layer 23 and the extending portion 350a are etched, the extending portion 350a facilitates to prevent an undercut structure from being formed underneath the second metal layer 351. Referring to FIG. 4E, preferably, the extending portion 350a has a width w of 1 um. The width w of the extending portion 350a meets the condition 0.5 μm≤2w≤20 um.

Thereafter, a conductive bump (referring to FIG. 2H) is formed on each of the metal structures 35, and the substrate 4 is applied in a packaging process.

According to the method of the present embodiment, since the width X of the first opening 420 is greater than the width Y of the second opening 440, the first metal layer 350 is formed with an extending portion 350a. Therefore, when the seed layer 23 is removed by etching using an etchant, the extending portion 350a of the first metal layer 350 consumes the etchant so as to prevent the etchant from over-eroding the first metal layer 350, thereby preventing an undercut structure from being formed underneath the second metal layer 351.

FIGS. 5A to 5D are schematic cross-sectional views showing a method for fabricating a substrate according to a fourth embodiment of the present invention.

Figure 5A:
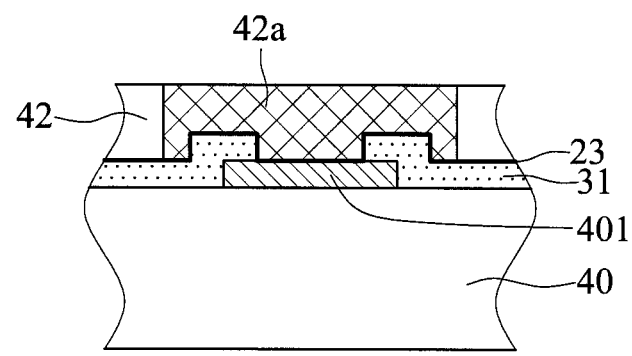
FIGS. 5A to 5D are schematic cross-sectional views showing a method for fabricating a substrate having an electrical interconnection structure according to a fourth embodiment of the present invention.

Referring to FIG. 5A, the structure of FIG. 4A is provided.

Figure 5B:
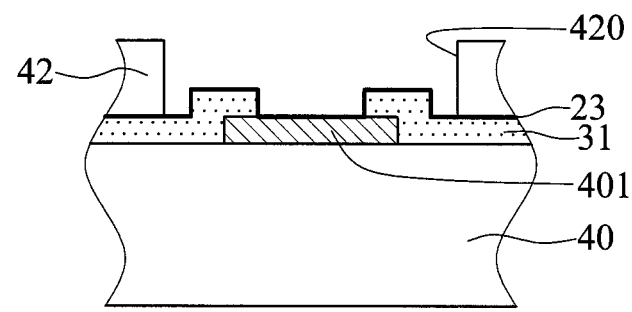

Referring to FIG. 5B, by performing a first development process, the first exposure areas 42a are developed to from a plurality of first openings 420.

Figure 5C:
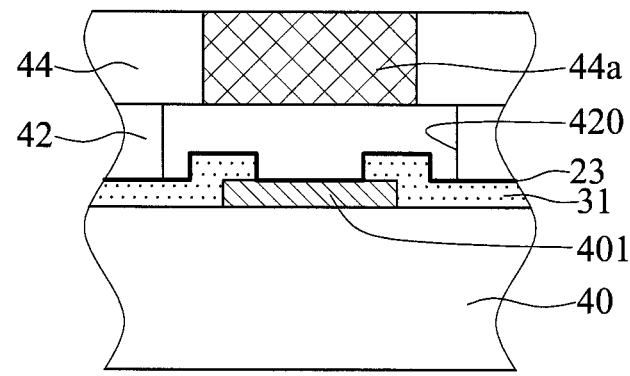

Referring to FIG. 5C, a second resist layer 44 is formed on the first resist layer 42. Then, an exposure process is performed on the second resist layer 44 so as to form a plurality of second exposure areas 44a in the second resist layer 44.

Figure 5D:
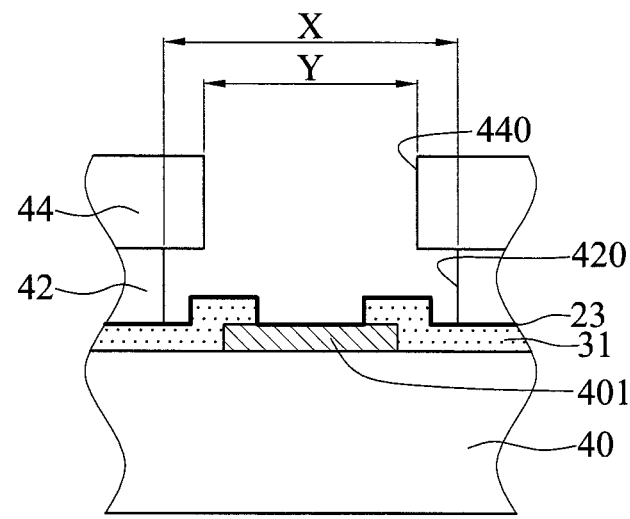

Referring to FIG. 5D, by performing a second development process, the second exposure areas 44a are developed to form plurality of second openings 440. Then, the processes as described in FIGS. 4D to 4F can be performed and detailed description thereof is omitted herein.

The present invention further provides a substrate 2 having an electrical interconnection structure. The substrate 2 has: a substrate body 20, 20', 20" having a first surface 20a with a plurality of conductive pads 201 and a second surface 20b opposite to the first surface 20a; a first passivation layer 21, formed on the first surface 20a of the substrate body 20, 20', 20", with at least a portion of each of the conductive pads 201 being exposed therefrom; a second passivation layer 22 formed on the first passivation layer 21, with the exposed portion of each of the conductive pads 201 being exposed therefrom; a first metal layer 250, 250', 250" formed on each of the conductive pads 201 and the first passivation layer 21 and embedded in the second passivation layer 22 without being protruded from the second passivation layer 22; and a second metal layer 251, 251', 251" formed on the first metal layer 250, 250', 250" and protruded from the second passivation layer 22.

The substrate body 20, 20', 20" can be made of a non-conductive material. The first metal layer 250 and the second metal layer 251 are formed into a portion of a UBM structure.

The substrate 2 can further have a seed layer 23 formed between the first metal layer 250, 250', 250" and the corresponding conductive pads 201 and between the first metal layer 250, 250', 250" and the first passivation layer 21. The seed layer 23 can be made of titanium, copper or a combination thereof.

In an embodiment, a plurality of conductive through holes 200 are formed to penetrate the first and second surfaces 20a, 20b of the substrate body 20', 20", and the conductive pads 201 are formed on ends of the conductive through holes 200.

In an embodiment, a conductive trace portion 203 is formed on the substrate body 20", and the conductive pads 201 and the first passivation layer 21 are formed on the conductive trace portion 203.

In an embodiment, the thickness t of the second passivation layer 22 is greater than the thickness h of the first passivation layer 21.

In an embodiment, the first metal layer 250" has a base portion 250a formed on the corresponding conductive pad 201 and a connection portion 250b formed on the base portion 250a.

In an embodiment, the material of the first metal layer 250, 250', 250" is different from that of the second metal layer 251, 251', 251".

In an embodiment, the material of the second metal layer 251, 251', 251" is different from that of the seed layer 23.

In an embodiment, the first metal layer 250, 250', 250" is a copper layer, and the second metal layer 251, 251', 251" is a nickel layer 251a, a gold layer 251b or a combination thereof.

In an embodiment, the substrate 2 further has a plurality of conductive bumps 26, 26' formed on the second metal layer 251, 251', 251". The conductive bump 26, 26' can be made of a solder material.

In an embodiment, the second passivation layer 22 is not positioned over the conductive pads 201.

In another embodiment, a portion of the second passivation layer 22 are positioned over each of the conductive pads 201.

Therefore, by preventing an undercut structure from being formed underneath the metal portions of the substrate, no adhesive residual or any other material will be left on the metal portions during subsequent processes. As such, when a semiconductor chip is flip-chip mounted to the conductive pads of the substrate, a good bonding can be formed between the conductive pads and the conductive bumps, thereby increasing the electrical interconnection quality between the semiconductor chip and the conductive pads and improving the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a substrate having an electrical interconnection structure, the method comprising:
    forming a passivation layer on a substrate body having a plurality of conductive pads and forming a plurality of first openings in the passivation layer for exposing at least a portion of each of the conductive pads;
    forming a seed layer on the passivation layer and the conductive pads;
    forming a first metal layer on a portion of the seed layer, wherein the portion of the seed layer is positioned between the first metal layer and the corresponding conductive pads and between the first metal layer and the passivation layer, wherein the first metal layer has an extending portion;

forming a second metal layer on the first metal layer, wherein the second metal layer is free from covering the extending portion of the first metal layer; and removing the seed layer under the extending portion, and removing the extending portion of the first metal layer while removing the seed layer under the extending portion.

2. The method of claim 1, wherein the seed layer is removed by etching.

3. The method of claim 1, after removing the seed layer, further comprising forming a plurality of conductive bumps on the second metal layer.

\* \* \* \* \*